United States Patent [19]
Mano

[11] Patent Number: 5,814,886
[45] Date of Patent: Sep. 29, 1998

[54] SEMICONDUCTOR DEVICE HAVING LOCAL CONNECTIONS FORMED BY CONDUCTIVE PLUGS AND METHOD OF MAKING THE SAME

[75] Inventor: Michio Mano, Kanagawa, Japan

[73] Assignee: Sony Corporation, Tokyo, Japan

[21] Appl. No.: 698,436

[22] Filed: Aug. 15, 1996

[30] Foreign Application Priority Data

Aug. 17, 1995 [JP] Japan .................................. 7-209796

[51] Int. Cl.⁶ ................................................. H01L 21/90
[52] U.S. Cl. ........................ 257/734; 257/382; 257/383; 257/377; 257/401
[58] Field of Search ........................... 365/174; 257/330, 257/751, 323, 618, 529, 393

[56] References Cited

U.S. PATENT DOCUMENTS 4,890,141  12/1989  Tang et al. ............................. 357/23.3
5,202,579  4/1993   Fuji et al. ................................. 257/751
5,293,053  3/1994   Malhi et al. ............................. 257/330
5,398,200  3/1995   Mazure et al. .......................... 365/174
5,574,308  11/1996  Mori et al. ............................... 257/618
5,600,165  2/1997   Tsukamoto et al. .................... 257/323
5,627,400  5/1997   Koga ....................................... 257/529
5,661,325  8/1997   Hayashi et al. ......................... 257/393

Primary Examiner—Viet Q. Nguyen
Attorney, Agent, or Firm—Hill & Simpson

[57] ABSTRACT

A process of production of a semiconductor device comprising the steps of forming a first interlayer insulating film for covering a transistor formed on a substrate; forming a contact hole which will be connected to the transistor and a contact hole for local connection which will connect locations near each other simultaneously; and filling the contact holes with a conductor to form conductive plugs.

8 Claims, 7 Drawing Sheets

SEMICONDUCTOR DEVICE HAVING LOCAL CONNECTIONS FORMED BY CONDUCTIVE PLUGS AND METHOD OF MAKING THE SAME

BACKGROUND OF THE INVENTION

1. Field of the Invention

The present invention relates to a semiconductor device having local connections, more particular to a semiconductor device having local connections composed of conductive plugs filled in an insulating layer.

2. Description of the Related Art

A semiconductor device having memory cells includes a large number of contacts in the cells. There are also numerous local connections which connect between locations near each other in a memory cell.

A contact is formed by forming a contact hole in a thick interlayer insulating film and implanting impurities to both the n-type diffusion region and p-type diffusion region separately in order to adjust the resistance and by burying the contact hole with a metal to form a metal plug. When forming a local connection, it is also necessary to separately form a contact hole and implant impurities to the n-type diffusion region and p-type diffusion region. Therefore, four steps were required to implant impurities to form the metal plug and the conventional process for manufacturing such a semiconductor device suffered from increased manufacturing costs.

In this specification, note, a "local connection" means not only a connection of diffusion regions, but also connection of locations near each other in a cell such as connection of inverters.

SUMMARY OF THE INVENTION

It is an object of the present invention to provide a semiconductor device which can simplify the manufacturing process.

Another object of the present invention is to provide a method of making a semiconductor device which can reduce the number of steps of the manufacturing process.

According to one aspect of the present invention, there is provided a semiconductor device having a transistor formed on a substrate; a first interlayer insulating film covering the transistor; a first interconnection which is connected to the transistor via a first contact hole through the first interlayer insulating film; a second interlayer insulating film on the first interlayer insulating film; and a second interconnection which is connected to the first interconnection via a second contact hole through the second interlayer insulating film; the first interconnection functioning as a local connection; the first interconnection including a conductive plug filling the first contact hole; and the second interconnection including a conductive plug filling the second contact hole.

According to another aspect of the present invention, there is provided a process of production of a semiconductor device comprising the steps of forming a first interlayer insulating film to cover a transistor formed on a substrate; forming a contact hole which will be connected to the transistor and a contact hole for local connection which will connect locations near each other simultaneously; and filling the contact holes with a conductor to form conductive plugs.

The semiconductor device of the present invention uses a conductive plug for not only the contact hole which will connect an interconnection to the substrate (ordinary contact hole) but also the contact hole which connects locations near each other in a cell as a local connection (interconnection contact hole). Therefore the ordinary and interconnection contact holes can be made simultaneously, so that ion implantation for compensation can be performed in two steps, that is, to the N+ diffusion region and to the P+ diffusion. Consequently, the lithography takes two steps in contrast to the previous four steps, so that two steps of lithography are reduced. According to the present invention, further, since the contact holes are buried in the early stage, flattening is easy. Thus, the semiconductor device of the present invention has the advantage of a reduction of manufacturing steps and therefore an improved yield.

BRIEF DESCRIPTION OF THE DRAWINGS

These and other objects and features of the present invention will become clearer by the following description of the present invention made with reference to the accompanying drawings, in which.

DESCRIPTION OF THE PREFERRED EMBODIMENTS

Before describing the preferred embodiments of the present invention, the related art will be described for background with reference to the drawings.

Figure 1:
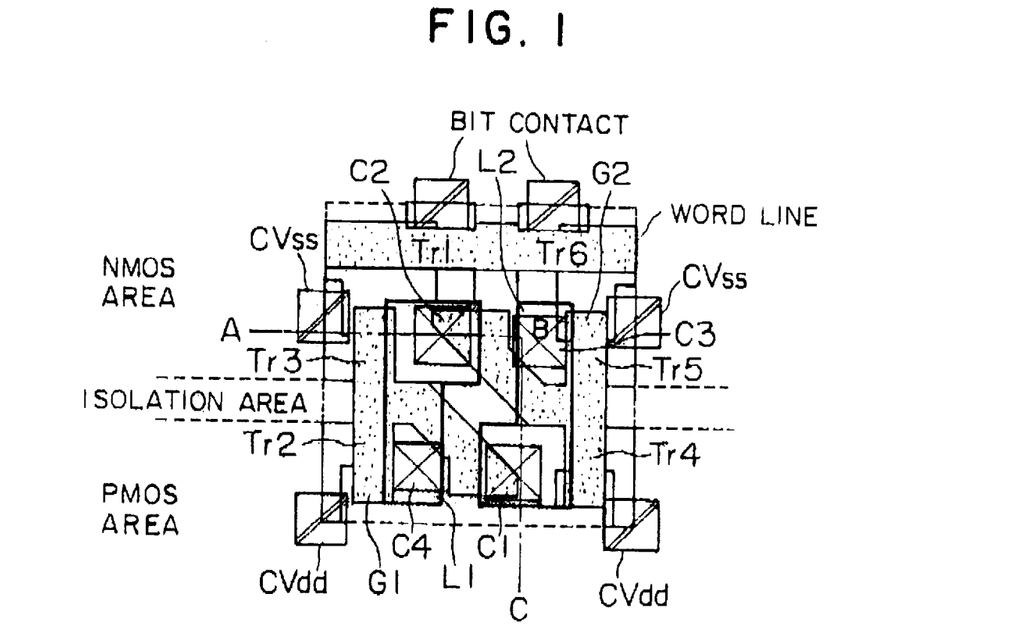
FIG. 1 is a plan view of a full CMOS SRAM.
Figure 2:
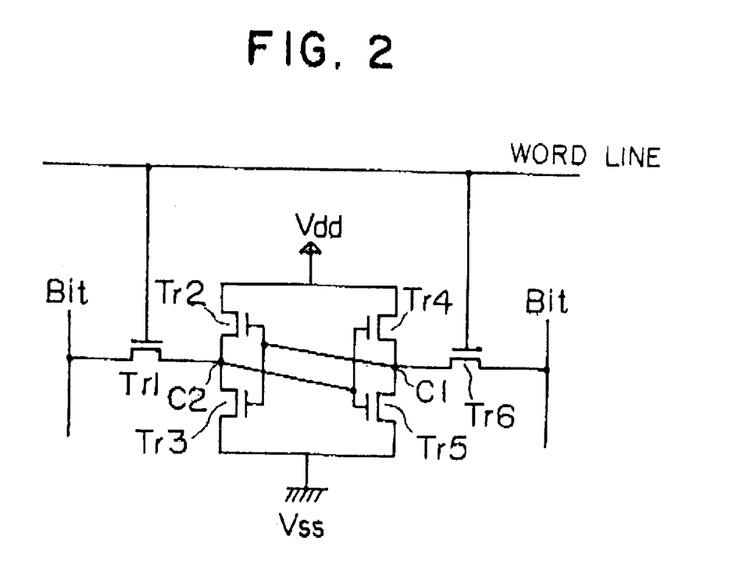
FIG. 2 shows an equivalent circuit of the full CMOS SRAM of FIG. 1.

A considerable number of contact holes are necessary when forming a full CMOS SRAM. FIG. 1 is a plan view of a cell of a full CMOS SRAM. FIG. 2 shows an equivalent circuit corresponding to the full CMOS SRAM of FIG. 1. A full CMOS SRAM has four NMOS transistors and two PMOS transistors in a silicon substrate. In FIGS. 1 and 2, the transistors Tr2 and Tr4 are PMOS transistors, while the other transistors are NMOS transistors. The transistors Tr2 and Tr3 comprise one inverter, while the transistors Tr4 and Tr5 comprise another inverter. Reference G1 in FIG. 1 (indicating the halftone area) shows a gate electrode connecting the gate between the transistors Tr2 and Tr3 and a contact C1. This contact C1 is connected to an interconnection L2 which connects the two diffusion regions of the transistor Tr4 and transistor Tr5. The gate electrode G2 of the transistor Tr4 and Tr5 similarly connects to the two diffusion regions of the transistors Tr3 and Tr2 by an interconnection L1 and a contact C2.

Figure 3:
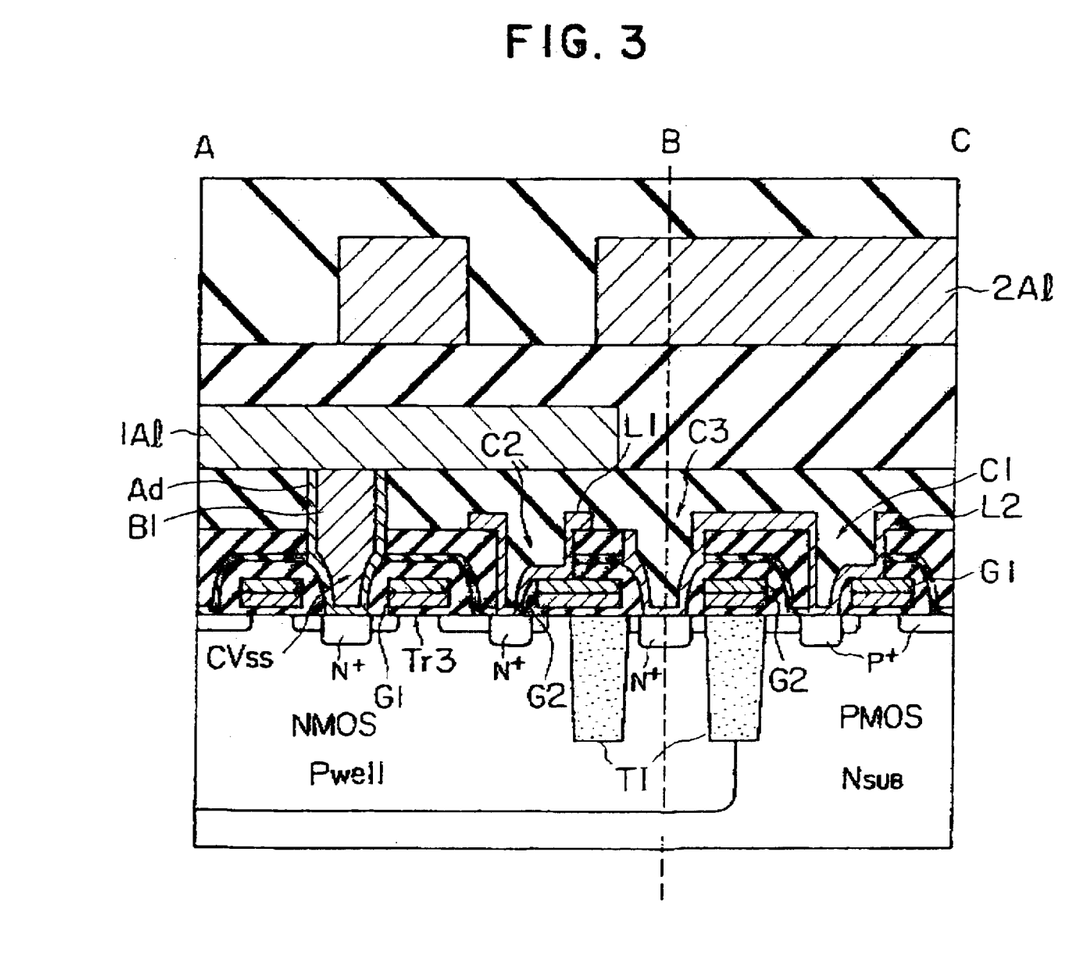
FIG. 3 is a sectional view, taken along the line A–B–C in FIG. 1, showing a conventional full CMOS SRAM.

FIG. 3 is a sectional view taken along the line A–B–C in FIG. 1. The dotted line B in FIG. 3 is a bending portion.

Trench isolation TI is used in the semiconductor device shown in FIG. 3 as the means for element isolation. A diffusion region of the transistor Tr3 is connected by a tungsten blanket BL to an aluminum interconnection 1A1 via an adhesion layer Ad which covers the inner wall of the contact hole $CV_{SS}$. The interconnections L1 and L2 are connected to the gate electrodes G1 and G2 by shared contacts C1 and C2.

Figure 4A:
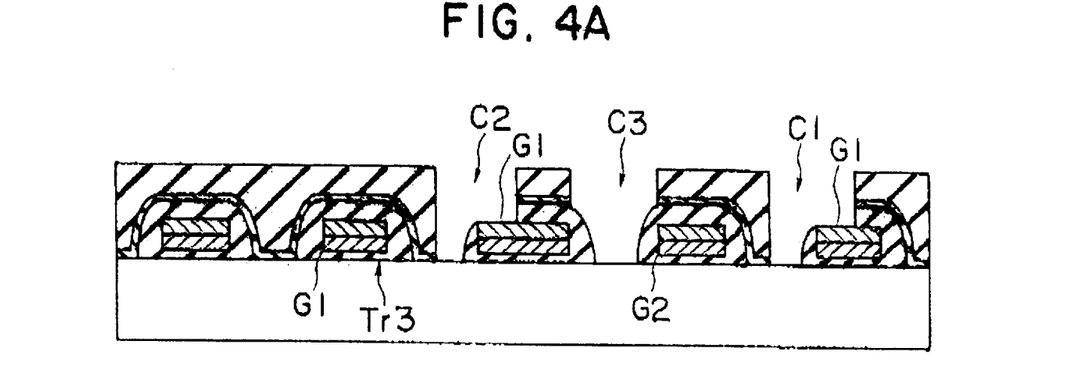
FIGS. 4A to 4D are sectional view corresponding to FIG. 3 showing various stages of manufacture.
Figure 4B:
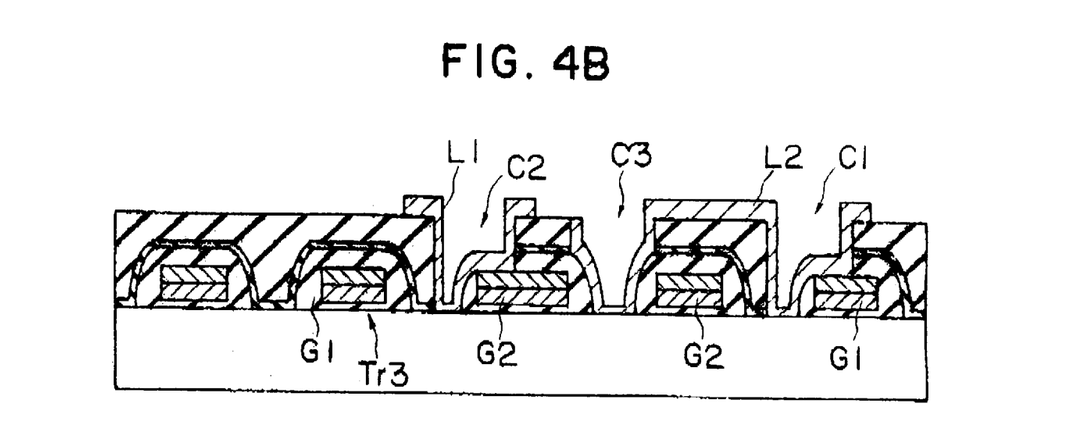

The process for forming the area around the interconnection in a conventional full CMOS SRAM shown in FIG. 3 will be described referring to FIGS. 4A to 4D. The resultant structure shown in FIG. 4A is achieved by the following steps. First, conventional techniques are used to form a field oxide layer and a gate electrode, produce a source and drain by ion implantation, and deposit silicon oxide to form an interlayer insulating film, then form contact holes C1 to C3 for the purpose of forming interconnections L1 and L2. After this, part of the surface of the gate electrodes G1 and G2 is exposed. In FIGS. 4A and 4B, note that illustration of the structures in the substrate is omitted for the purpose of simplifying the figures.

Then, each N+ diffusion region and P+ diffusion region is subjected to ion implantation for contact compensation, then activating annealing is performed for example at 800° C. for 10 minutes. Next, as shown in FIG. 4B, interconnections L1 and L2 are formed by depositing a refractory metal such as TiN and patterning.

Figure 4C:
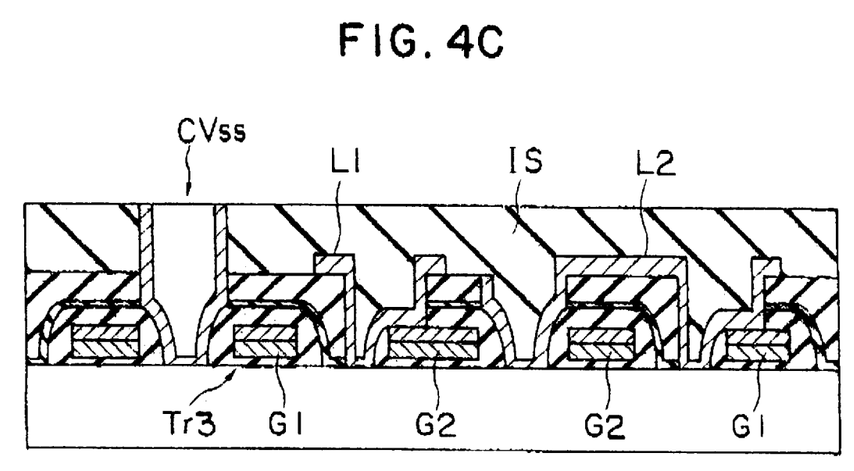

Then, as shown in FIG. 4C, the contact holes C1 to C3 are buried by depositing silicon oxide to form an interlayer insulating film IS, a contact hole $CV_{SS}$ for connecting the aluminum interconnection is formed, and ion implantation for contact compensation is performed for each N+ diffusion and P+ diffusion region. Ti and TiN for forming the adhesion layer Ad are then deposited to a thickness of about 30 nm and 70 nm respectively. A tungsten layer is deposited to a thickness of about 600 nm and then etched back to form a tungsten plug in the contact hole $CV_{SS}$.

Figure 4D:
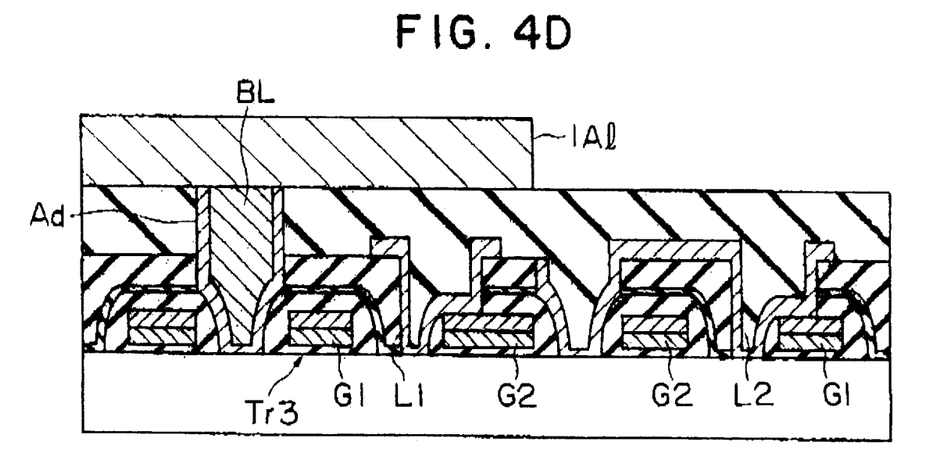

Next, as shown in FIG. 4D, an aluminum interconnection 1A1 is formed which connects to the diffusion region of the transistor Tr3.

According to this conventional process, ion implantation is performed for both the N+ diffusion region and P+ diffusion region in a state of opened contact holes. When performing the ion implantation for one diffusion region, the other diffusion region must be covered with a photoresist. Therefore, four photolithographic steps are required, which are too many. In addition, in this process of forming interconnections by opening contact holes and burying the contact holes with an interlayer insulating layer, there is the problem that the flattening step takes too much time, because of the large step differences of the contact holes.

Next, a preferred embodiment of the present invention will be described with reference to the drawings.

Figure 5:
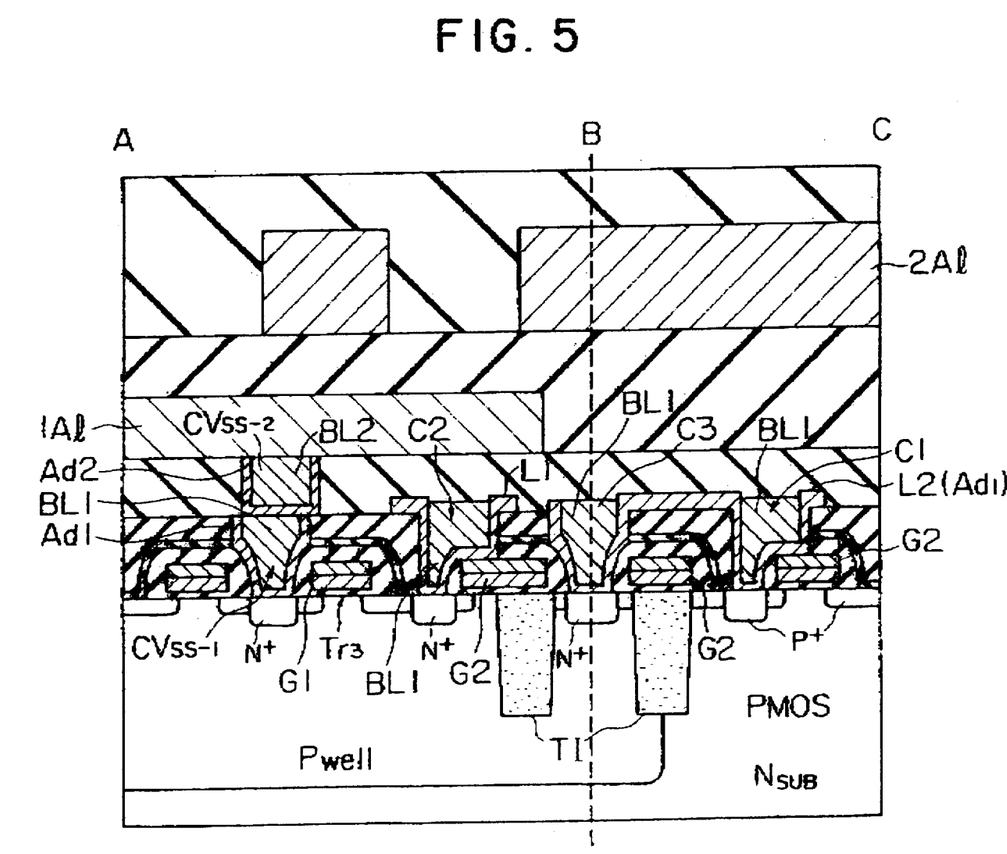
FIG. 5 is a sectional view, taken along the line A–B–C in FIG. 1, according to one embodiment of the full CMOS SRAM of the present invention.

FIG. 5 is a sectional view of a full CMOS SRAM seen in FIG. 1 and FIG. 2 according to an embodiment of the present invention corresponding to the conventional SRAM shown in FIG. 3. FIG. 5 is a sectional view taken along the line A–B–C in FIG. 1, so the semiconductor device of the present invention has the same plan view as a conventional one.

Trench isolation TI is used in the semiconductor device shown in FIG. 5 as the means of element isolation. A diffusion region of the transistor Tr3 is connected to an aluminum interconnection 1A1 by a first conductive plug BL1 which fills a first contact hole $CV_{SS}$-1 and a second conductive plug BL2 which fills a second contact hole $CV_{SS}$-2 via a first adhesion layer Ad1 which covers the inner wall of the first contact hole $CV_{SS}$-1 and a second adhesion layer Ad2 which covers the inner wall of the contact hole $CV_{SS}$-2. The first conductive plug BL1 and first adhesion layer Ad1 comprise a first interconnection.

The interconnections L1 and L2 are composed of the first adhesion layer Ad1 and connect to the gate electrodes G1 and G2 by the shared contacts C1 and C2. The contact holes $CV_{SS}$-1 and C1 to C3 are filled with the conductive plugs BL1. A conductive plug is preferably composed of a metal such as tungsten. In this specification, note that "tungsten" is a general concept including not only tungsten metal but also tungsten alloys.

Figure 6A:
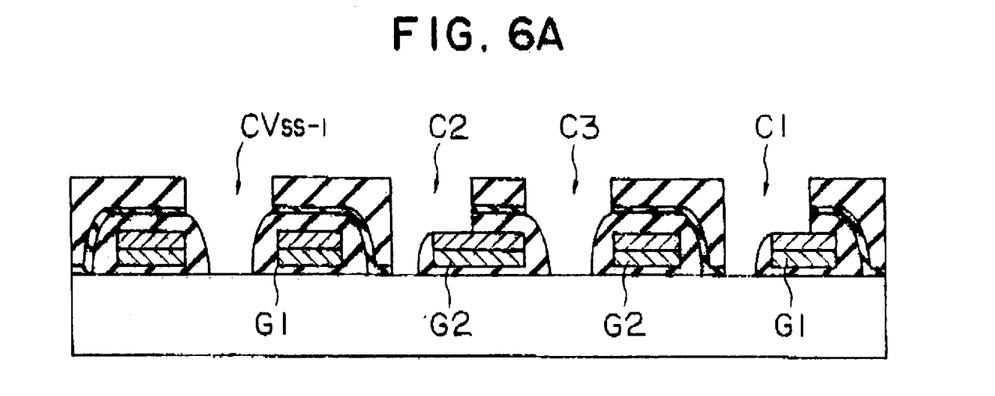
FIGS. 6A to 6D are sectional views corresponding to FIG. 5 showing various stages of manufacture of an SRAM.

The process for formation of the area around a local connection in a full CMOS SRAM of the present invention shown in FIG. 5 will be described referring to FIGS. 6A to 6D. The resultant structure shown in FIG. 6A is achieved by the following steps. Conventional MOS manufacturing processes are first used to form a field oxide layer and a gate electrode, produce a source and drain by ion implantation, and form a first interlayer insulating film by depositing silicon oxide. Then, a first contact hole $CV_{SS}$-1 which will be connected to an aluminum interconnection 1A1 and first contact holes C1 to C3 for interconnection are formed simultaneously.

Next, the N+ diffusion region and P+ diffusion region are subjected to ion implantation for contact compensation. In this step, according to the present invention, the photoresists applied to the N+ diffusion region and P+ diffusion region are subjected to photolithography once each, so only a total of two photolithographic steps are enough to implant impurities for contact compensation for all contact holes. Consequently the photolithographic process takes only two steps in contrast to the conventional four steps, that is, there is a reduction of two steps of photolithography.

Then, annealing for activation is performed for example at 800° C. for 10 minutes. In this case, according to the present invention, one annealing step for activation of the contacts is enough. In addition, when performing the annealing, since no adhesion layer is yet formed, the annealing does not affect the adhesion layer. In the conventional process, after forming an interconnection, annealing was needed for activation, so that Ti, which has a low contact resistance with silicon, could not be used for the adhesion layer because of its low heat resistance. But according to the present invention, Ti can be used for the adhesion layer.

Figure 6B:
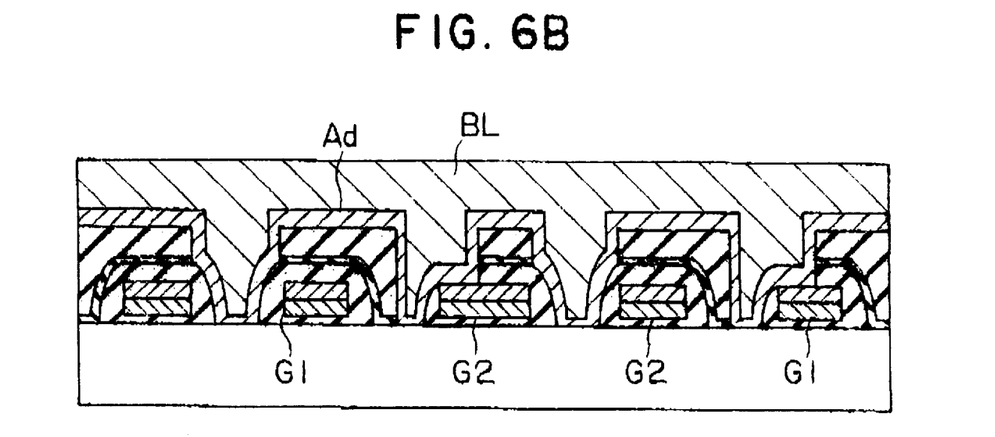

Then, as shown in FIG. 6B, Ti or TiN for forming the first adhesion layer Ad is deposited to a thickness of about 30 nm or 70 nm respectively and tungsten BL is deposited to a thickness of about 600 nm.

Figure 6C:
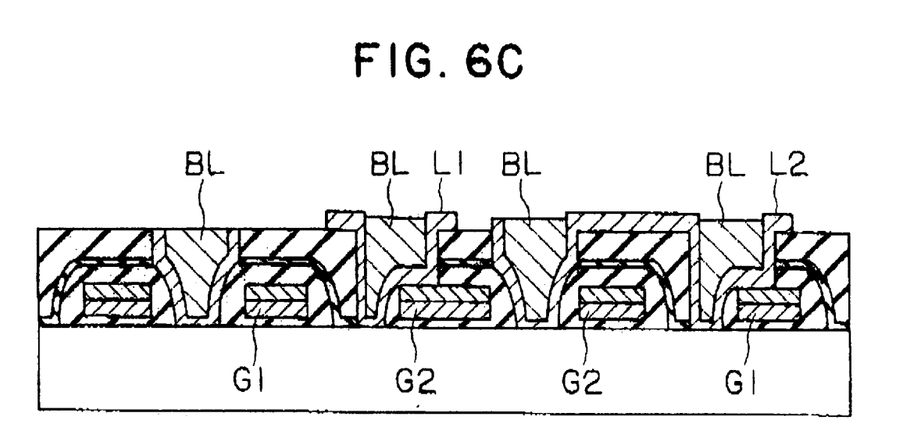

Then, as shown in FIG. 6C, the tungsten is selectively etched back to remain leave the first tungsten plugs BL in the contact holes. The exposed adhesion layer is patterned to form the interconnections L1 and L2. In this step, since the adhesion layer is used as the interconnection L1, no additional step of depositing a conductive layer is needed.

Figure 6D:
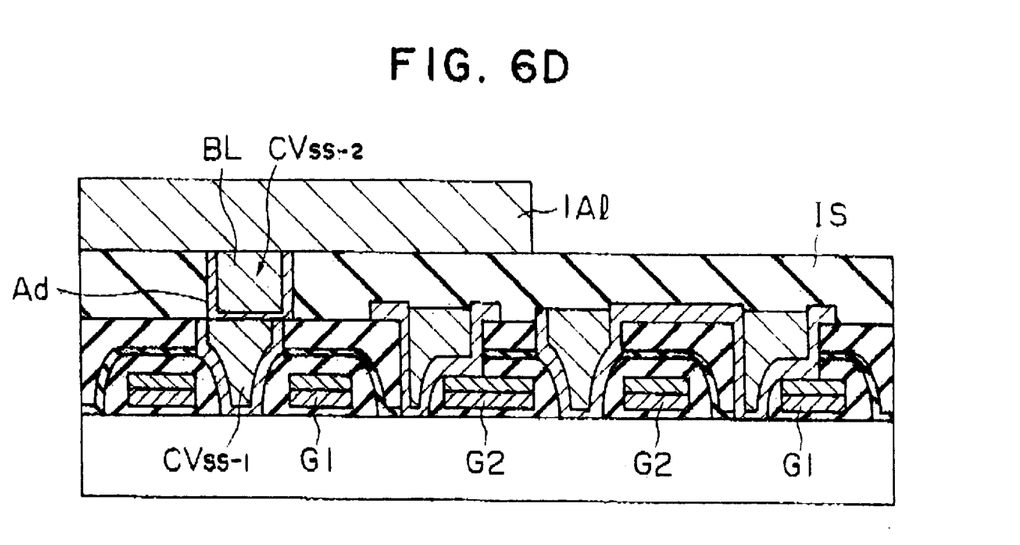

Then, as shown in FIG. 6D, a second interlayer insulating film is formed by CVD and is flattened. In this step, according to this embodiment, since all contact holes are filled with tungsten plugs, flattening is easier than burying the contact holes with an interlayer insulating layer. Next, the second contact hole $CV_{SS}$-2 for connecting an aluminum interconnection is formed, then Ti or TiN for forming the second adhesion layer Ad2 is deposited to a thickness of about 30 nm or 70 nm respectively and tungsten is deposited to a thickness of about 600 nm. The tungsten layer is selectively etched back to leave the second tungsten plug B2 in the contact hole. Then, the first aluminum interconnection 1A1 is formed by depositing and patterning aluminum using photolithography in the conventional manner. In this case, the second tungsten plug BL2 and the second adhesion region Ad2 comprise a second interconnection.

After FIG. 6D, conventional techniques are used to form the interlayer insulating layer, form the second aluminum interconnection layer, and form another interlayer insulating film to obtain the finished SRAM as shown in FIG. 5.

While this invention has been described with reference to illustrative embodiments, this description is not intended to be construed in a limiting sense. various modifications of the illustrative embodiments, such as semiconductor memory devices other than a SRAM as explained above, are also included.

What is claimed is:

1. A semiconductor device comprising:

a transistor formed on a substrate;

a first interlayer insulating film covering said transistor;

a first interconnection which is connected to said transistor via a first contact hole through the first interlayer insulating film;

a second interlayer insulating film on the first interlayer insulating film; and a second interconnection which is connected to the first interconnection via a second contact hole through the second interlayer insulating film;

said first-interconnection functioning as a local connection;

said first interconnection including a conductive plug filling said first contact hole;

said second interconnection including a conductive plug filling said second contact hole.

2. A semiconductor device according to claim 1, wherein said semiconductor device include an NMOS and PMOS transistor in one substrate.

3. A semiconductor device according to claim 1, wherein said semiconductor device is an SRAM.

4. A semiconductor device according to claim 1, wherein said conductive plug is composed of tungsten.

5. A semiconductor device according to claim 1, wherein said first interconnection includes said conductive plug and an adhesion layer covering an inner wall of said first contact hole.

6. A semiconductor device according to claim 5, wherein said adhesion layer is composed of TiN and/or Ti.

7. A semiconductor device according to claim 5, wherein said adhesion layer functions as a local connection.

8. A semiconductor device as claimed in claim 3, wherein a gate of a first inverter of said SRAM is connected by said local connection to a diffusion region of a second inverter of said SRAM.

* * * * *